US012609153B2

(12) United States Patent
Yang

(10) Patent No.: US 12,609,153 B2
(45) Date of Patent: Apr. 21, 2026

(54) MEMORY DEVICE AND NOISE SUPPRESSION METHOD THEREOF

(71) Applicant: NANYA TECHNOLOGY CORPORATION, New Taipei City (TW)

(72) Inventor: Wu-Der Yang, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 262 days.

(21) Appl. No.: 18/531,731

(22) Filed: Dec. 7, 2023

(65) Prior Publication Data

US 2025/0191636 A1     Jun. 12, 2025

(51) Int. Cl.
*G11C 11/4072* (2006.01)
*G11C 11/4076* (2006.01)
*G11C 11/4096* (2006.01)
*G11C 11/4078* (2006.01)

(52) U.S. Cl.
CPC ............................... *G11C 11/4076* (2013.01)

(58) Field of Classification Search
CPC ............ G11C 11/4076; G11C 11/4072; G11C 11/4078; G11C 11/4096
See application file for complete search history.

(56) References Cited

U.S. PATENT DOCUMENTS

| | | | | |
|---|---|---|---|---|
| 2010/0293406 A1* | 11/2010 | Welker | ................ | G06F 13/1689 |
| | | | | 713/401 |
| 2014/0016404 A1* | 1/2014 | Kim | ...................... | G11C 11/165 |
| | | | | 365/158 |
| 2015/0028954 A1* | 1/2015 | Tyan | ................... | G11C 11/4076 |
| | | | | 330/257 |
| 2015/0124539 A1* | 5/2015 | Iijima | .................. | G11C 7/1093 |
| | | | | 365/193 |
| 2022/0358994 A1 | 11/2022 | Song et al. | | |

FOREIGN PATENT DOCUMENTS

KR         20220127450 A  *  9/2022  ............. G11C 7/222

OTHER PUBLICATIONS

Translation of KR 20220127450 A (Year: 2022).*
"Office Action of Taiwan Counterpart Application", issued on Oct. 23, 2024, p. 1-p. 5.

* cited by examiner

*Primary Examiner* — Khamdan N. Alrobaie
*Assistant Examiner* — Elizabeth Rose Agger
(74) *Attorney, Agent, or Firm* — JCIPRNET

(57) ABSTRACT

A memory device and a noise suppression method thereof are provided. An input receiving circuit of a memory circuit receives a data strobe differential signal pair. A noise suppression circuit provides a noise suppression resistor connected between an input terminal of the input receiving circuit and a ground voltage during a write data strobe signal off period before a write preamble period.

9 Claims, 6 Drawing Sheets

Determine whether a memory device enters a write data strobe signal off period before a write preamble period ⁓S702

When the memory device enters the write data strobe signal off period, provide a noise suppression resistor connected between an input terminal of the input receiving circuit and a ground voltage ⁓S704

MEMORY DEVICE AND NOISE SUPPRESSION METHOD THEREOF

BACKGROUND

Technical Field

The invention relates to an electronic device, and particularly relates to a memory device and a noise suppression method thereof.

Description of Related Art

In a low power DDR4 (LPDDR4) dynamic random access memory (DRAM), there may be situations where a control signal output by a controller to a memory circuit violates a timing definition of a solid state technology association (JEDEC) standard on a data strobe signal (DQS) before a preamble period. For example, during a write data strobe signal off period before a write preamble period, the data strobe signals DQS_t and DQS_c are both at a low logic level.

Since the data strobe signals DQS_c and DQS_t are a differential signal pair, any small signal may be amplified to generate a noise signal that may cause circuit malfunction, especially when an on die terminator (ODT) of the dynamic random access memory is maintained to an off state, it is more likely to generate noise signals that may cause malfunction of the circuit.

SUMMARY

The invention is directed to a memory device and a noise suppression method thereof, where when a data strobe signal pair is at a low logic level during a write data strobe signal off period, it effectively prevents a noise signal from being amplified into a noise signal that is enough to cause circuit malfunction.

The invention provides a memory device including a memory circuit and a noise suppression circuit. The memory circuit receives data according to the data strobe differential signal pair. The memory circuit includes an input receiving circuit that receives the data strobe differential signal pair. The noise suppression circuit is coupled to an input terminal of the input receiving circuit, and provides a noise suppression resistor connected between the input terminal of the input receiving circuit and a ground voltage during a write data strobe signal off period before a write preamble period.

In an embodiment of the invention, the input receiving circuit is a differential amplifier, and the noise suppression circuit includes a first switch circuit, a first resistor, a second switch circuit and a second resistor. The first resistor and the first switch circuit are connected in series between a first input terminal of the differential amplifier and the ground voltage. The second resistor and the second switch circuit are connected in series between a second input terminal of the differential amplifier and the ground voltage. The first switch circuit and the second switch circuit provide the first resistor connected between the first input terminal of the differential amplifier and the ground voltage and the second resistor connected between the second input terminal of the differential amplifier and the ground voltage during the write data strobe signal off period.

In an embodiment of the invention, the data strobe differential signal pair includes a first data strobe signal and a second data strobe signal, and the differential amplifier amplifies the first data strobe signal and the second data strobe signal and outputs a first output signal and a second output signal from a first output terminal and a second output terminal thereof. The first switch circuit includes a first switch and a second switch. The second switch and the first switch are connected in series between the first input terminal of the differential amplifier and the first resistor, a conduction state of the first switch is controlled by the first data strobe signal or the first output signal, and a conduction state of the second switch is controlled by the second data strobe signal or the second output signal.

In an embodiment of the invention, the first switch and the second switch are transistors.

In an embodiment of the invention, the data strobe differential signal pair includes a first data strobe signal and a second data strobe signal, the differential amplifier amplifies the first data strobe signal and the second data strobe signal and outputs a first output signal and a second output signal from a first output terminal and a second output terminal thereof. The second switch circuit includes a third switch and a fourth switch. The fourth switch and the third switch are connected in series between the second input terminal of the differential amplifier and the second resistor. A conduction state of the third switch is controlled by the first data strobe signal or the first output signal, and a conduction state of the fourth switch is controlled by the second data strobe signal or the second output signal.

In an embodiment of the invention, the third switch and the fourth switch are transistors.

In an embodiment of the invention, the memory device further includes a control circuit coupled to the memory circuit, the control circuit provides the data strobe differential signal pair, and the memory circuit receives data from the control circuit according to the data strobe differential signal pair.

The invention provides a noise suppression method of a memory device, the memory device includes an input receiving circuit, the input receiving circuit receives a data strobe differential signal pair. The noise suppression method of the memory device includes following steps. It is determined whether the memory device enters a write data strobe signal off period before a write preamble period. When the memory device enters the write data strobe signal off period, a noise suppression resistor connected between an input terminal of the input receiving circuit and a ground voltage is provided.

In an embodiment of the invention, the input receiving circuit is a differential amplifier, and the noise suppression method of the memory device includes following steps. A first switch circuit, a first resistor, a second switch circuit and a second resistor are provided, where the first resistor and the first switch circuit are connected in series between a first input terminal of the differential amplifier and the ground voltage, and the second resistor and the second switch circuit are connected in series between a second input terminal of the differential amplifier and the ground voltage. The first switch circuit and the second switch circuit are controlled to respectively provide the first resistor connected between the first input terminal of the differential amplifier and the ground voltage and the second resistor connected between the second input terminal of the differential amplifier and the ground voltage during the write data strobe signal off period.

In an embodiment of the invention, the data strobe differential signal pair includes a first data strobe signal and a second data strobe signal, and the differential amplifier amplifies the first data strobe signal and the second data strobe signal and outputs a first output signal and a second output signal from a first output terminal and a second output terminal thereof. The first switch circuit includes a first switch and a second switch. The second switch and the first switch are connected in series between the first input terminal of the differential amplifier and the first resistor, a conduction state of the first switch is controlled by the first data strobe signal or the first output signal, and a conduction state of the second switch is controlled by the second data strobe signal or the second output signal.

In an embodiment of the invention, the first switch and the second switch are transistors.

In an embodiment of the invention, the data strobe differential signal pair includes a first data strobe signal and a second data strobe signal, the differential amplifier amplifies the first data strobe signal and the second data strobe signal and outputs a first output signal and a second output signal from a first output terminal and a second output terminal thereof, the second switch circuit includes a third switch and a fourth switch, the fourth switch and the third switch are connected in series between the second input terminal of the differential amplifier and the second resistor, a conduction state of the third switch is controlled by the first data strobe signal or the first output signal, and a conduction state of the fourth switch is controlled by the second data strobe signal or the second output signal.

In an embodiment of the invention, the third switch and the fourth switch are transistors.

Based on the above description, the noise suppression circuit of the embodiment of the invention is adapted to provide a noise suppression resistor connected between the input terminal of the input receiving circuit and the ground voltage during the write data strobe signal off period before the write preamble period, so that when the data strobe signal pair is at a low logic level during the write data strobe signal off period, it may effectively prevent the noise signal from being amplified into a noise signal that is enough to cause circuit malfunction.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
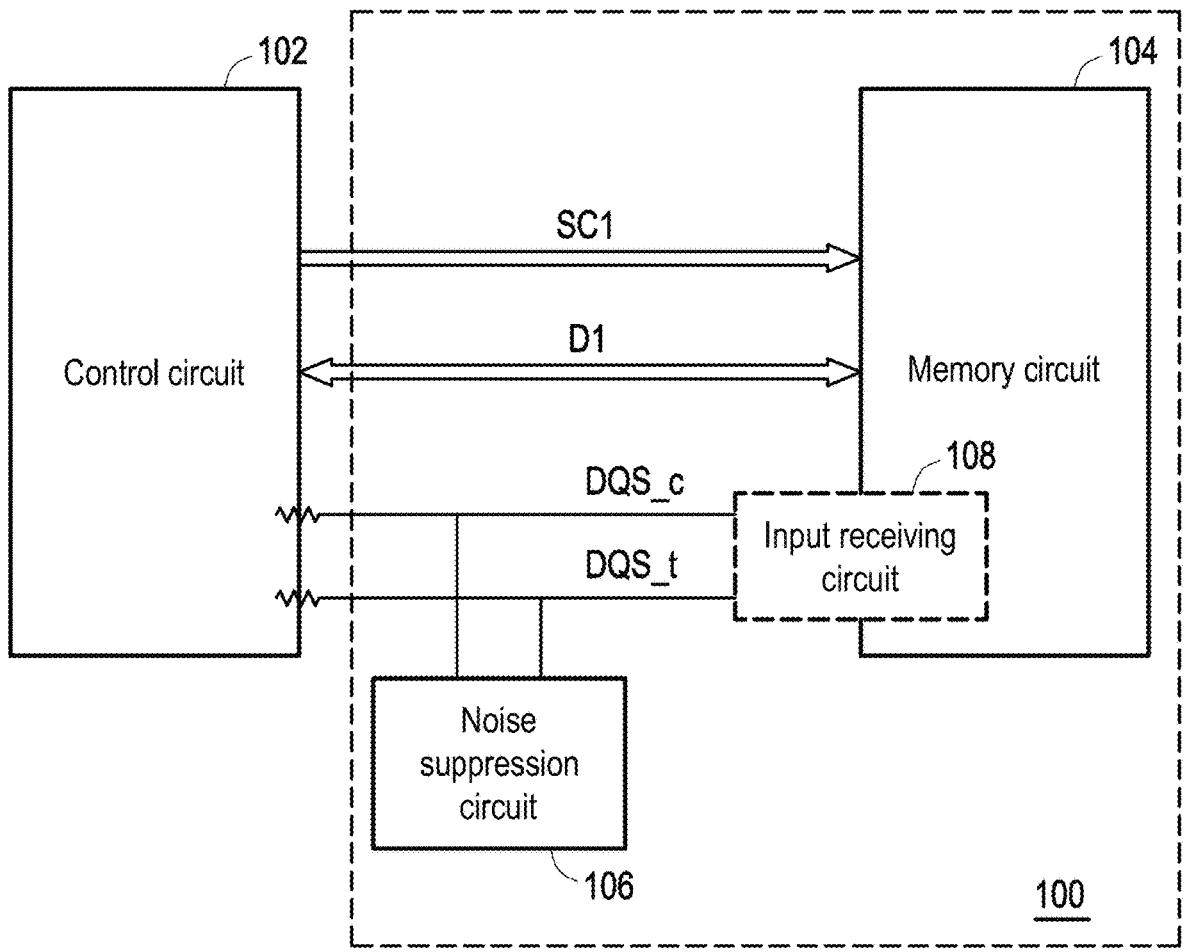
FIG. 1 is a schematic diagram of a memory device according to an embodiment of the invention.

FIG. 1 is a schematic diagram of a memory device according to an embodiment of the invention. Referring to FIG. 1, a memory device 100 includes a memory circuit 104 and a noise suppression circuit 106, where the memory circuit 104 has an input receiving circuit 108, and the memory circuit 104 is coupled to the control circuit 102 and the input receiving circuit 108. The noise suppression circuit 106 is coupled to an input terminal of the input receiving circuit 108. The control circuit 102 may output a command control signal SC1 and a data strobe differential signal pair (including data strobe signals DQS_c and DQS_t) to the memory circuit 104, where the command control signal SC1 is used to control a data access operation of the memory circuit 104, so as to transmit a data signal D1 between the control circuit 102 and the memory circuit 104, and the data strobe signals DQS_c and DQS_t are used to trigger an access operation of the memory circuit 104. The control circuit 102 may be, for example, a processor or a central processing unit, and the memory device 100 may be, for example, a low power DDR4 dynamic random access memory, but the invention is not limited thereto. In some embodiments, the control circuit 102 may also be, for example, integrated into the memory device 100 without being limited by this embodiment.

Figure 2:
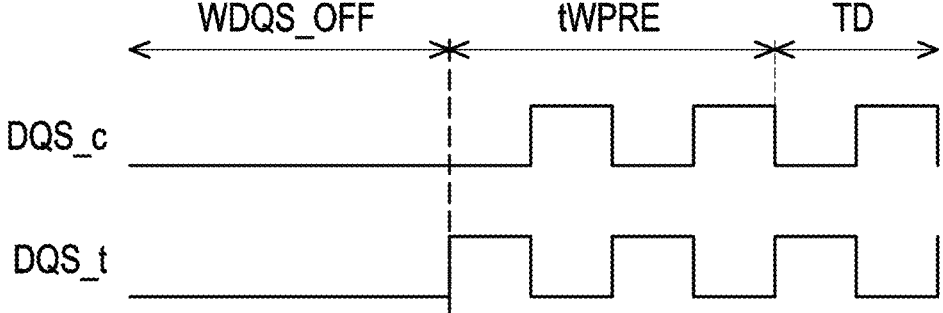
FIG. 2 is a schematic waveform diagram of data strobe signals DQS_c and DQS_t according to an embodiment of the invention.

As shown in FIG. 2, the data strobe signals DQS_c and DQS_t form a differential signal pair. When the data strobe signals DOS c and DQS_t are both set to a low voltage logic level during a write data strobe signal off period WDQS_OFF before a write preamble period tWPRE, the input terminal of the input receiving circuit 108, which is a differential input terminal, may receive a noise signal. If a noise signal appears at the input terminal of the input receiving circuit 108, the noise signal may be amplified to be enough to cause malfunction of the memory circuit 104 to access wrong data during a data transmission period TD. To avoid such situation, the noise suppression circuit 106 may provide a noise suppression resistor connected between the input terminal of the input receiving circuit 108 and a ground voltage during the write data strobe signal off period WDQS_OFF, and the noise suppression resistor may divide a voltage of the noise signal (for example, to perform voltage dividing through a voltage dividing circuit formed with an output resistor CR of the control circuit 102) to prevent the noise signal from being amplified into a noise signal that is enough to cause malfunction of the memory circuit 104.

Figure 3:
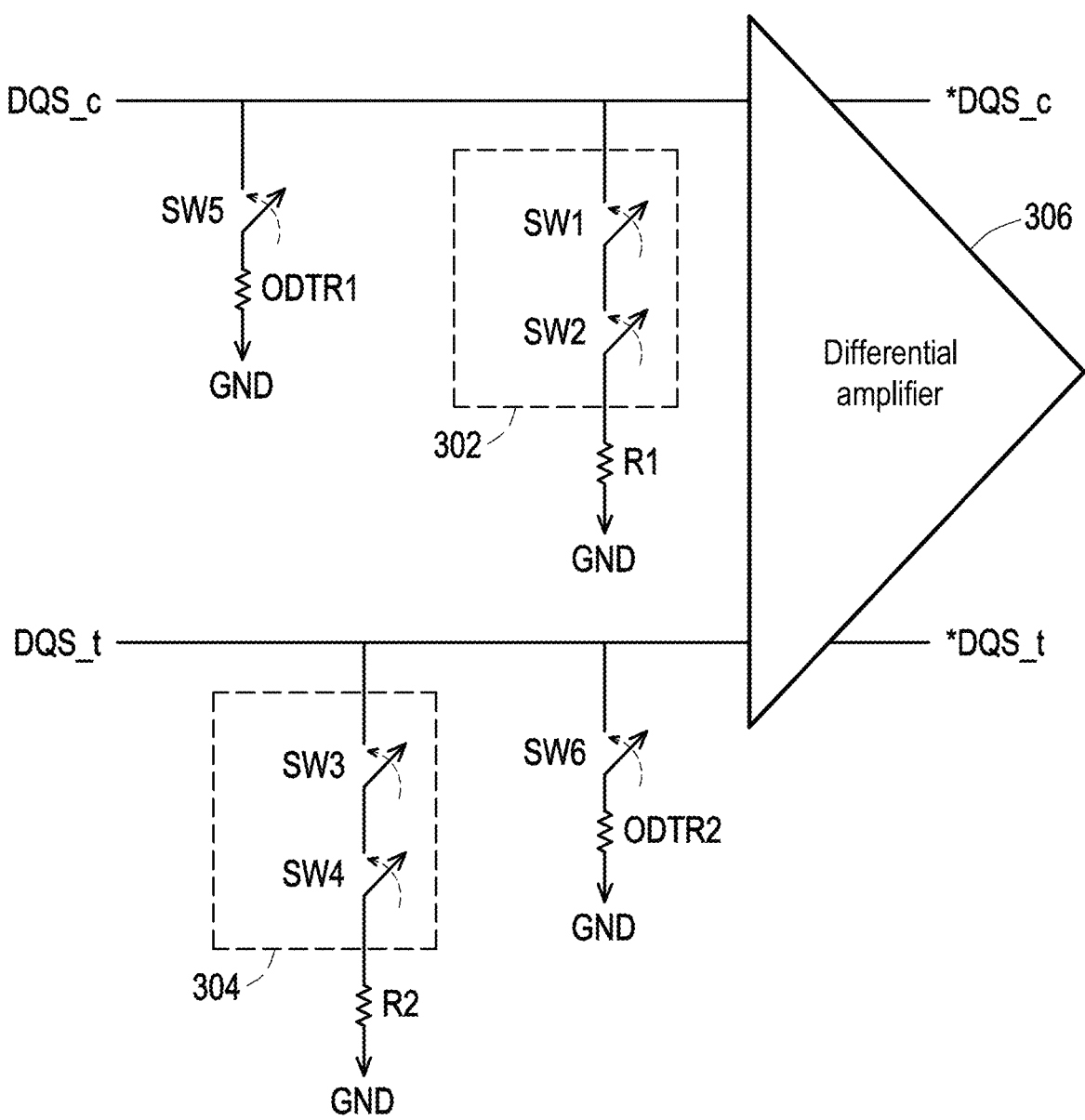
FIG. 3 is a schematic diagram of an input receiving circuit and a noise suppression circuit according to an embodiment of the invention.

Furthermore, the implementation of the input receiving circuit 108 and the noise suppression circuit 106 may be as shown in FIG. 3. In the embodiment of FIG. 3, the input receiving circuit 108 is implemented by a differential amplifier 306, and the noise suppression circuit 106 may include switch circuits 302 and 304 and resistors R1 and R2. The differential amplifier 306 has a first input terminal and a second input terminal. The switch circuit 302 and the resistor R1 are connected in series between the first input terminal of the differential amplifier 306 and the ground voltage GND, and the switch circuit 304 and the resistor R2 are connected in series between the second input terminal of the differential amplifier 306 and the ground voltage GND. The switch circuits 302 and 304 may provide a resistor R1 connected between the first input terminal of the differential amplifier 306 and the ground voltage GND and a resistor R2 connected between the second input terminal of the differential amplifier 306 and the ground voltage GND during the write data strobe signal off period WDQS_OFF.

Figure 4:
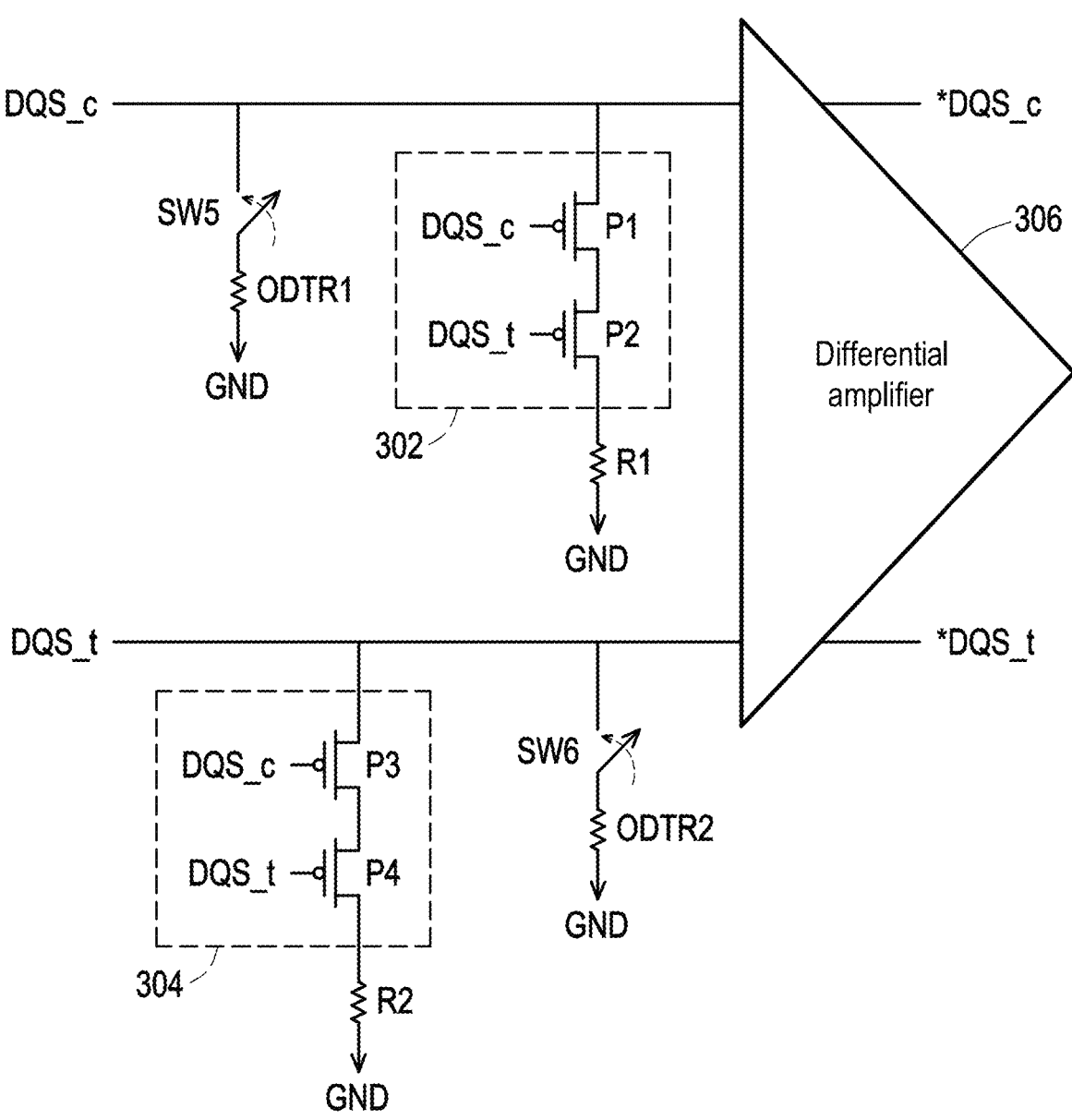
FIG. 4 is a schematic diagram of an input receiving circuit and a noise suppression circuit according to another embodiment of the invention.

In the embodiment, the switch circuit 302 is implemented by switches SW1 and SW2 connected in series, and the switch circuit 304 is implemented by switches SW3 and SW4 connected in series, where conduction states of the switches SW1 and SW3 may be controlled by the data strobe signal DQS_c, and conduction states of the switches SW2 and SW4 may be controlled by the data strobe signal DQS_t. In this way, when the data strobe signals DQS_c and DQS_t are both at low voltage levels, the switch circuits 302 and 304 may be in a conductive state to provide the resistor R1 connected between the first input terminal of the differential amplifier 306 and the ground voltage GND and the resistor R2 connected between the second input terminal of the differential amplifier 306 and the ground voltage GND. The switches SW1-SW4 may be, for example, implemented by P-type transistors P1-P4, as shown in FIG. 4. In other embodiments, the switches SW1 to SW4 may also be implemented by, for example, N-type transistors. In addition, the conduction states of the switches SW1 and SW3 may also be controlled, for example, by an output signal *DQS_c output from a first output terminal of the differential amplifier 306 according to the data strobe signal DQS_c, and the conduction states of the switches SW2 and SW4 may be controlled, for example, by an output signal *DQS_t output from a second output terminal of the differential amplifier 306 according to the data strobe signal DQS_t.

Figure 5:
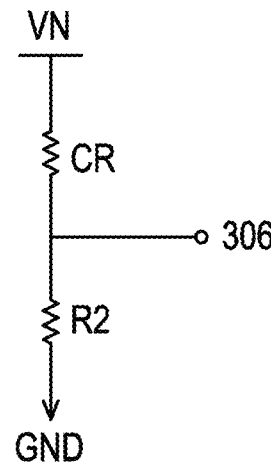
FIG. 5 is a schematic diagram of a noise suppression resistor and an output resistor of a control circuit according to an embodiment of the invention.

When a resistor of an on die terminator (ODT) of the memory device 100 is turned off (i.e., when the switches SW5 and SW6 in FIG. 3 and FIG. 4 are turned off), taking the second input terminal of the differential amplifier 306 as an example, an equivalent resistance circuit of the second input terminal of the differential amplifier 306 may be as shown in FIG. 5. Since the switch SW6 is turned off, a resistor ODTR2 of the on die terminator may be ignored. In such configuration, a voltage dividing circuit formed by the output resistor CR of the control circuit 102 and the resistor R2 of the noise suppression circuit 106 may divide a voltage of the noise signal appeared on the second input terminal of the differential amplifier, thereby achieving an effect of suppressing the noise signal and preventing the noise signal from being amplified into a noise signal that is enough to cause malfunction of the memory circuit 104. Similarly, the first input terminal of the differential amplifier 306 may also form a voltage dividing circuit composed of the output resistor CR of the control circuit 102 and the resistor R1 of the noise suppression circuit 106 to suppress the noise signal appeared on the first input terminal of the differential amplifier. For example, if a voltage value VN of the noise signal that appeared on the second input terminal of the differential amplifier 306 was equal to 134 mV, the output resistance CR of the control circuit 102 was 50 ohm, and the resistance R1 of the noise suppression circuit 106 was 40 ohm, then the voltage value of the noise signal at the second input terminal of the differential amplifier 306 would be suppressed to 59 mV.

Figure 6:
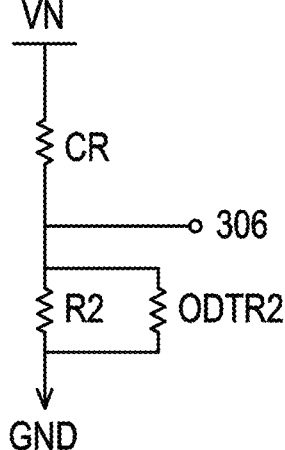
FIG. 6 is a schematic diagram of a noise suppression resistor, an on die terminator resistor and an output resistor of a control circuit according to an embodiment of the invention.

In addition, when the resistor of the on die terminator of the memory device 100 is turned on (i.e., when the switches SW5 and SW6 in FIG. 3 and FIG. 4 are turned on), the resistors R1 and R2 provided by the switch circuits 302 and 304 may further suppress the noise signal at the second input terminal of the differential amplifier 306. As shown in FIG. 6, taking the second input terminal of the differential amplifier 306 as an example, compared to the embodiment of FIG.

5, an equivalent resistance circuit of the second input terminal of the differential amplifier 306 may further include the resistor ODTR2 of the on die terminator, and the output resistor CR of the control circuit 102 is connected in series with the resistor R2 and the resistor ODTR2 connected in parallel to further suppress the noise signal at the second input terminal of the differential amplifier 306. For example, if the voltage value VN of the noise signal that appeared on the second input terminal of the differential amplifier 306 was equal to 134 mV, the output resistor CR of the control circuit 102 was 50 ohm, and the resistor R1 of the noise suppression circuit 106 and the resistor ODTR2 were both 40 ohm, then the voltage value of the noise signal at the second input terminal of the differential amplifier 306 would be suppressed to 38 mV.

Figure 7:
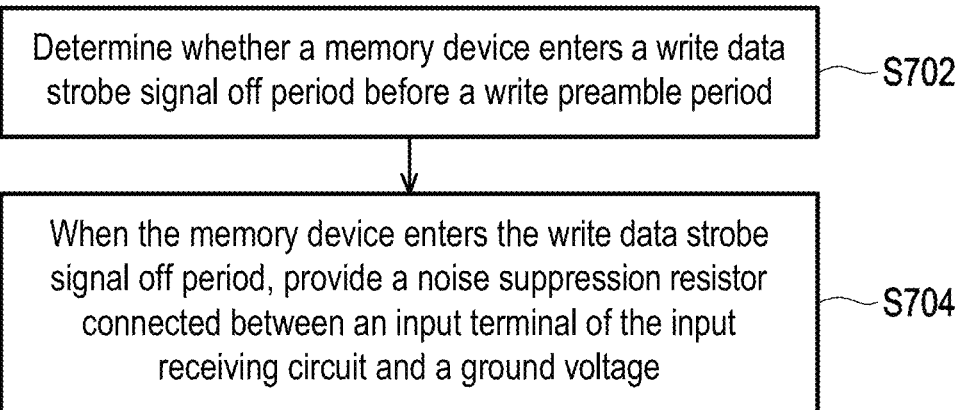
FIG. 7 is a flowchart of a noise suppression method for a memory device according to an embodiment of the invention.

FIG. 7 is a flowchart of a noise suppression method for a memory device according to an embodiment of the invention. The memory device includes an input receiving circuit. The input receiving circuit receives a data strobe differential signal pair (which includes a first data strobe signal and a second data strobe signal). It may be seen from the above embodiments that the noise suppression method of the memory device may include at least the following steps. First, it is determined whether the memory device enters the write data strobe signal off period before the write preamble period (step S702). Then, when the memory device enters the write data strobe signal off period, a noise suppression resistor connected between an input terminal of the input receiving circuit and the ground voltage is provided (step S704), such that the voltage of the noise signal is divided by a voltage dividing circuit formed by the noise suppression resistor and the output resistor of the control circuit to prevent the noise signal from being amplified into a noise signal that may cause malfunction of the memory circuit.

Furthermore, the input receiving circuit may be, for example, a differential amplifier, and a method of providing the noise suppression resistor may be, for example, providing a first switch circuit, a second switch circuit, a first resistor and a second resistor, where the first resistor and the first switch circuit are connected in series between the first input terminal of the differential amplifier and the ground voltage, and the second resistor and the second switch circuit are connected in series between the second input terminal of the differential amplifier and the ground voltage. During the write data strobe signal off period, by turning on the first switch circuit and the second switch circuit, a first resistor connected between the first input terminal of the differential amplifier and the ground voltage and a second resistor connected between the second input terminal of the differential amplifier and the ground voltage are respectively provided. The first switch circuit may, for example, include a first switch and a second switch, and the second switch circuit may, for example, include a third switch and a fourth switch. The first switch and the second switch are connected in series between the first input terminal of the differential amplifier and the first resistor, and the third switch and the fourth switch are connected in series between the second input terminal of the differential amplifier and the second resistor. A conduction state of the first switch and the third switch may be controlled, for example, by the first data strobe signal or a first output signal output by a first output terminal of the differential amplifier. A conduction state of the second switch and the fourth switch may be controlled, for example, by the second data strobe signal or a second output signal output by a second output terminal of the differential amplifier. In this way, the first to fourth switches may be turned on when the first data strobe signal and the second data strobe signal are at a low logic level, so as to provide the first resistor and the second resistor as noise suppression resistors, where the first switch to the fourth switch may be, for example, implemented by transistors.

In summary, the noise suppression circuit of the embodiment of the invention may provide a noise suppression resistor connected between the input terminal of the input receiving circuit and the ground voltage during the write data strobe signal off period before the write preamble period, so that when the data strobe signal pair is at a low logic level during the write data strobe signal off period, it may effectively prevent the noise signal from being amplified into a noise signal that is enough to cause circuit malfunction.

What is claimed is:

1. A memory device, comprising:

a memory circuit, receiving data according to a data strobe differential signal pair, wherein the memory circuit comprises:

an input receiving circuit, receiving the data strobe differential signal pair, wherein the input receiving circuit is a differential amplifier; and a noise suppression circuit, coupled to an input terminal of the input receiving circuit, and providing a noise suppression resistor connected between the input terminal of the input receiving circuit and a ground voltage during a write data strobe signal off period before a write preamble period, wherein the noise suppression circuit comprises:

a first switch circuit, comprising;

a first switch; and a second switch, wherein the second switch and the first switch are connected in series between a first input terminal of the differential amplifier and a first resistor, a conduction state of the first switch is controlled by a first data strobe signal or a first output signal, and a conduction state of the second switch is controlled by a second data strobe signal or a second output signal;

the first resistor, wherein the first resistor and the first switch circuit are connected in series between the first input terminal of the differential amplifier and the ground voltage;

a second switch circuit; and a second resistor, wherein the second resistor and the second switch circuit are connected in series between a second input terminal of the differential amplifier and the ground voltage, wherein, during the write data strobe signal off period, the first switch circuit and the second switch circuit provide the first resistor connected between the first input terminal of the differential amplifier and the ground voltage and the second resistor connected between the second input terminal of the differential amplifier and the ground voltage during the write data strobe signal off period;

wherein the data strobe differential signal pair comprises the first data strobe signal and the second data strobe signal, and the differential amplifier amplifies the first data strobe signal and the second data strobe signal and outputs the first output signal and the second output signal from a first output terminal and a second output terminal thereof.

2. The memory device as claimed in claim 1, wherein the first switch and the second switch are transistors.

3. The memory device as claimed in claim 1, wherein the data strobe differential signal pair comprises the first data strobe signal and the second data strobe signal, the differential amplifier amplifies the first data strobe signal and the second data strobe signal and outputs the first output signal and the second output signal from the first output terminal and the second output terminal thereof, wherein the second switch circuit comprises:

a third switch; and a fourth switch, wherein the fourth switch and the third switch are connected in series between the second input terminal of the differential amplifier and the second resistor, a conduction state of the third switch is controlled by the first data strobe signal or the first output signal, and a conduction state of the fourth switch is controlled by the second data strobe signal or the second output signal.

4. The memory device as claimed in claim 3, wherein the third switch and the fourth switch are transistors.

5. The memory device as claimed in claim 3, further comprises:

a control circuit, coupled to the memory circuit, the control circuit provides the data strobe differential signal pair, and the memory circuit receives data from the control circuit according to the data strobe differential signal pair.

6. A noise suppression method of a memory device, wherein the memory device comprises an input receiving circuit, and the input receiving circuit receives a data strobe differential signal pair, wherein the input receiving circuit is a differential amplifier, and the noise suppression method of the memory device comprises:

determining whether the memory device enters a write data strobe signal off period before a write preamble period;

providing a noise suppression resistor connected between an input terminal of the input receiving circuit and a ground voltage in response to the memory device entering the write data strobe signal off period;

providing a first switch circuit, a second switch circuit, a first resistor, and a second resistor, wherein a second switch and a first switch are connected in series between a first input terminal of the differential amplifier and the first resistor, a conduction state of the first switch is controlled by a first data strobe signal or a first output signal, and a conduction state of the second switch is controlled by a second data strobe signal or a second output signal, the first resistor and the first switch circuit are connected in series between the first input terminal of the differential amplifier and the ground voltage, and the second resistor and the second switch circuit are connected in series between a second input terminal of the differential amplifier and the ground voltage; and controlling the first switch circuit and the second switch circuit to respectively provide the first resistor connected between the first input terminal of the differential amplifier and the ground voltage and the second resistor connected between the second input terminal of the differential amplifier and the ground voltage during the write data strobe signal off period, wherein the data strobe differential signal pair comprises the first data strobe signal and the second data strobe signal, and the differential amplifier amplifies the first data strobe signal and the second data strobe signal and outputs the first output signal and the second output signal from a first output terminal and a second output terminal thereof.

7. The noise suppression method of the memory device as claimed in claim 6, wherein the first switch and the second switch are transistors.

8. The noise suppression method of the memory device as claimed in claim 6, wherein the data strobe differential signal pair comprises the first data strobe signal and the second data strobe signal, the differential amplifier amplifies the first data strobe signal and the second data strobe signal and outputs the first output signal and the second output signal from the first output terminal and the second output terminal thereof, and the second switch circuit comprises:

a third switch; and a fourth switch, wherein the fourth switch and the third switch are connected in series between the second input terminal of the differential amplifier and the second resistor, a conduction state of the third switch is controlled by the first data strobe signal or the first output signal, and a conduction state of the fourth switch is controlled by the second data strobe signal or the second output signal.

9. The noise suppression method of the memory device as claimed in claim 8, wherein the third switch and the fourth switch are transistors.

* * * * *